United States Patent [19]

Dinger et al.

[11] Patent Number: 4,608,510

[45] Date of Patent: Aug. 26, 1986

[54] PIEZOELECTRIC MICRO-RESONATEUR

[75] Inventors: Rudolf J. Dinger; Jean-Georges Michel, both of Neuchâtel, Switzerland

[73] Assignee: Asulab S.A. - ESA 55, Switzerland

[21] Appl. No.: 339,152

[22] Filed: Jan. 13, 1982

[30] Foreign Application Priority Data

Jan. 15, 1981 [CH] Switzerland .................. 234/81

[51] Int. Cl.[4] ........................................... H01L 41/08
[52] U.S. Cl. .................................... 310/361; 310/346; 310/366; 310/368; 310/348
[58] Field of Search ............... 310/361, 367, 368, 366, 310/346, 360, 348

[56] References Cited

U.S. PATENT DOCUMENTS

| | | | |
|---|---|---|---|
| 1,977,169 | 10/1934 | Cady | 310/366 X |
| 2,194,539 | 3/1940 | Barry et al. | 310/366 X |
| 2,223,537 | 12/1940 | Sykes | 310/366 X |
| 3,885,174 | 5/1975 | Schoenfelder | 310/361 X |
| 3,906,260 | 9/1975 | Oguchi | 310/346 |
| 4,139,793 | 2/1979 | Michel | 310/368 X |
| 4,216,402 | 8/1980 | Engdahl | 310/368 X |

FOREIGN PATENT DOCUMENTS

| | | | |
|---|---|---|---|
| 0132186 | 10/1979 | Japan | 310/367 |
| 0052621 | 4/1980 | Japan | 310/368 |

Primary Examiner—Mark O. Budd
Attorney, Agent, or Firm—Allegretti, Newitt, Witcoff & McAndrews, Ltd.

[57] ABSTRACT

The micro-resonator comprises, cut from the same quartz crystal, a bar and a suspension frame means. The bar is cut in a substantially Z cut mode. The excitation electrodes are disposed on the sides of the bar. The length of the bar is substantially parallel to the Y axis.

This produces a resonator which vibrates in a main mode of extension-compression, at from 0.5 MHz to 4 MHz.

5 Claims, 8 Drawing Figures

PIEZOELECTRIC MICRO-RESONATEUR

BACKGROUND OF THE INVENTION

The present invention concerns a piezoelectric micro-resonator.

More precisely, the invention concerns a piezoelectric micro-resonator which vibrates in a main extension-compression mode and which is provided with a suspension assembly which is integral with the bar.

Piezoelectric micro-resonators in the form of bars are well known. They comprise a substantially parallelpipedal bar, for example of quartz, which has two faces, an upper face and a lower face, and two sides, and electrodes which are disposed on the bar. The electrodes are connected to an alternating current source and produce in the piezoelectric material, electrical fields the directions of which are fixed by the position of the electrodes. Moreover, it is well known that the electrical field produces stresses in the crystal, the direction of which depends on the direction of the electrical fields produced in the crystal with respect to the axis of the crystal. As is well known, a distinction is made for example in regard to quartz between the optical axis Z and systems of two orthogonal axis X and Y respectively an electric axis and a mechanical axis, which are contained in a plane perpendicular to the axis Z. A piezoelectric bar is said to be of Z cut when the upper and lower faces of the bar are substantially perpendicular to the optical axis Z. It will be appreciated that many other cuts are possible, but the invention is concerned with the case of piezoelectric bars with a cut in the vicinity of the Z cut.

Such piezoelectric micro-resonators are used in many situations, in particular for the production of time-keeping devices. Time-keeping devices of this kind are involved in the production of oscillator circuits forming the time bases for computers or electronic watches. In the case of watches, the resonators used are housed in sealed casings, the dimensions of which are to be as small as possible. The resonator itself must therefore be of very small dimensions. In addition, in watches, the only electrical power source is a battery which supplies in particular the resonator. In order to increase the service life of the battery, it is therefore necessary to use components which have the minimum possible level of power consumption. This obviously applies to the resonator, the energizing of which must require the minimum possible amount of electrical power. Now, the amount of power required increases in proportion to a decreasing quality factor. In addition, the electronic amplifier circuit required for energizing the oscillator must have a high output to convert the power supplied by the battery into a periodic signal in phase with the vibrations of the resonator. It is difficult to produce such a circuit, with a very low level of power consumption, in integrated form, when the piezoelectric coupling of the resonator is weak. The above-mentioned coupling may be measured by means of the dynamic capacity ($C_1$) of the resonator. The value $C_1$ for the Z cut bar operating in the extension-compression mode and provided with a system of electrodes according to the invention is given by the formula:

$$C_1 = \frac{1}{127} \epsilon_0 \epsilon_r \frac{L \cdot t}{w}$$

in which $\epsilon_r$ is the dielectric constant of the material used; L is the length of the electrode; w is the distance between the two sides of the bar (width) and t is the distance between the upper and lower faces (thickness).

A piezoelectric resonator in bar form provided with suspension arms, which vibrates in an extension-compression mode, is already known from Swiss Pat. No. 600.423. This resonator is shown in cross section and in simplified form in FIG. 1 of the accompanying drawings. The bar 2, the faces 2a and 2b of which are parallel to the plane XY is provided with two electrodes 4a and 6a on the edge of the upper face 2a and two electrodes 4b and 6b on the lower face 2b, with those electrodes being parallel to the Y direction. By setting the electrodes 4a and 4b at the same potential $V_1$ and the electrodes 6a and 6b at another potential $V_2$, an electrical field E is produced in the bar, which has a non-zero component on the X axis. This therefore provides a resonator which vibrates in extension-compression according to the Y axis. In addition, with the bar being perpendicular to the Z axis, it is easy for the bar to be cut with an outstanding degree of accuracy, by chemical attack. However, the excitation produced by means of the component of the electrical field which is parallel to the X axis is low. This means that the dynamic capacity of such a resonator is low, of the order of 0.1 fF, thus making it very difficult to produce a stable oscillator with a very low level of power consumption.

Also known are resonators which are produced by mechanical processes, having electrodes on the faces which are perpendicular to the X axis, to produce a sufficient piezoelectric coupling effect. However, these resonators do not have any fixing assembly which forms an integral part of the bar, so that they have to be mounted in the casing by means of conductor wires which are soldered to the faces of the resonator. Such a mode of assembly is obviously difficult and does not permit mass production.

BRIEF SUMMARY OF THE INVENTION

In order to remedy those disadvantages, a first object of the invention is to provide a piezoelectric resonator in the form of a Z cut bar and provided with an integrated fixing assembly which has a high degree of piezoelectric coupling, equivalent to that of a quartz of DT type.

A second object of the invention is to provide such a resonator which can be produced by simple processes compatible with large-scale mass production, in particular by chemical etching.

A third object of the invention is to provide such a resonator which has a frequency range which can go from 0.5 MHz (upper limit of tuning forks) to about 4 MHz (lower limit of economic AT-cut quartzes). To attain the above-indicated aims, the invention provides starting from a bar which is substantially of Z cut and which is provided with a fixing asembly and producing a metallisation portion on each side of the bar to form two electrodes, thus creating an electrical field parallel to the X axis.

It is clear that, the bar being of Z cut type, machining thereof and also machining of the supporting arms is easy, using chemical etching processes. In addition, as the electrical field generated by the electrodes is in actual fact parallel to the X axis, the piezoelectric coupling effect is at a high level and the electrical consumption for sustaining the oscillation is low. Because the electrical field must be parallel to the X axis, the edges of the metallisation portions produced on the sides of the bar do not need to be defined with a high degree of accuracy. It is not critical for a very slight metallisation to occur on the edges of the upper or lower faces. Finally, as there is no functional metallisation on the upper and lower faces of the bar, the width of the bar, that is to say, the distance between the two sides thereof, can be reduced. This results in a reduction in the dimensions of the bar and further enhancement in motional capacitance $C_1$.

In accordance with an alternative embodiment, the metallisation portions on the two sides may form an odd number n of pairs of electrodes which are disposed facing each other. By permutation of the polarisation of the consecutive pairs of electrodes, with a bar of a given length L, it is possible to produce working frequencies: $f' = n.f_o$, $f_o$ being the frequency of the bar provided with a single electrode on each of its sides, and n being an odd integer.

The frequency $f_o$ (kHz) of a quartz crystal is given by the formula: $f_o = 2750/L$; wherein L is the length of the bar (mm).

BRIEF DESCRIPTION OF THE DRAWINGS

Other features and advantages of the invention will be more clearly apparent from the following description of a number of embodiments of the invention, which are given by way of non-limiting examples. The description refers to which the accompanying drawings in which.

DETAILED DESCRIPTION OF THE PREFERRED EMBODIMENTS

Figure 1:
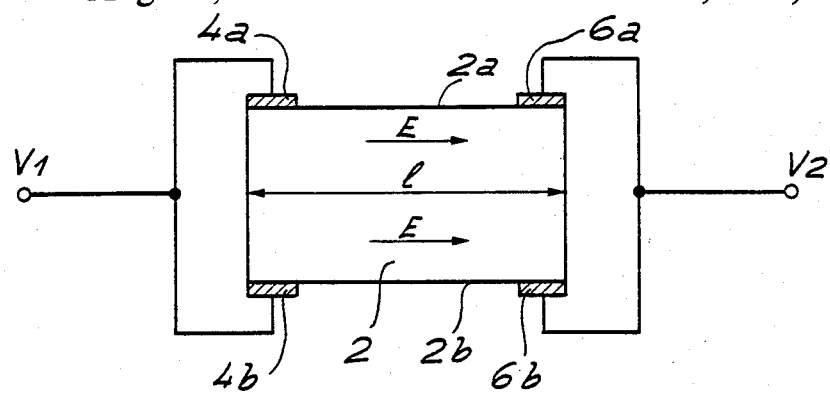
FIG. 1 which has already been described is a view in cross-section of a prior art resonator.
Figure 2:
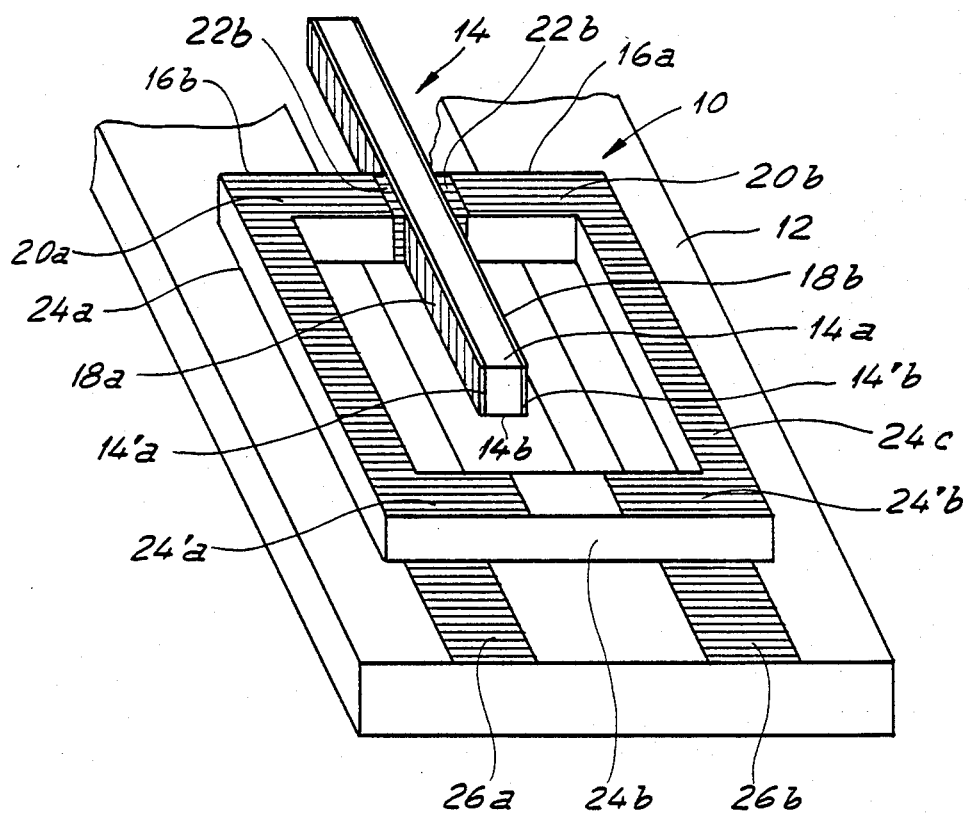
FIG. 2 is a perspective view of a first embodiment of the resonator according to the invention, with the resonator being mounted on a support member.

FIG. 2 shows a perspective view of a resonator 10 according to the invention, which is mounted on a support member 12.

The resonator comprises a bar 14 which is of substantially parallelepipedal shape and which comprises quartz or any other suitable piezoelectric material. It also comprises a fixing and suspension system formed by two suspension arms 16a and 16b connected to the bar substantially at the center of its length. The bar 14 and the arms 16a and 16b are cut from the same quartz plate. The bar 14 has two faces 14a and 14b, being respectively an upper face and a lower face, and two sides 14'a and 14'b, except of course for the regions in which the arms 16a and 16b are connected to the bar. On the other hand, the faces 14a and 14b are totally without any metallisations or at least are virtually totally without metallisation, as will be described hereinafter. The upper faces of the arms 16a and 16b are also covered with metallisation portions 20a and 20b which are respectively connected to the metallisation portions 18a and 18b by connecting metallisation portions 22a and 22b. The arms are advantageously extended by frame elements 24a, 24b and 24c which complete the assembly for fixing to the support member 12. It will be appreciated that the above-mentioned elements comprise metallisation portions 24'a and 24'b which are electrically connected to conducting tracks 26a and 26b deposited on the support member 12. The above-mentioned frame could be completed in a symmetrical configuration and thus completely surround the bar 14.

Figure 4A:
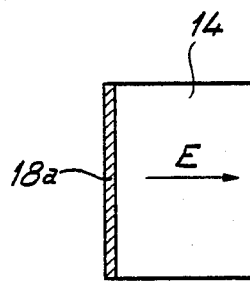
FIGS. 4a and 4b show the mode of excitation of the resonators according to the invention.
Figure 4B:
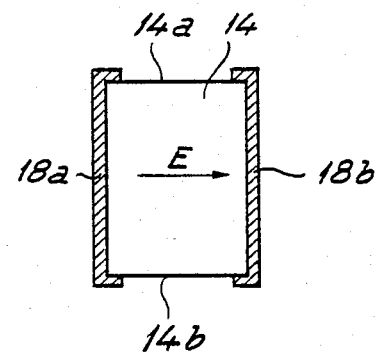

The metallisation portions 18a and 18b form the electrodes for exciting the bar 14. According to the invention, the bar 14 and the arms 16a and 16b are cut from the same quartz plate perpendicular to the optical axis Z of the quartz and the bar is disposed along the electrical axis Y of the quartz. Thus, as will be clearly seen from FIG. 4a, the electrical field generated by the electrodes 18a and 18b is in fact parallel to the electrical axis X of the quartz and the piezoelectric coupling effect obtained is very good. FIG. 4b shows that the metallisation portions may overlap slightly on to the upper and lower faces 14a and 14b of the quartz, without that substantially interfering with the direction of the electrical field generated in the quartz. It is therefore clear that, when the electrodes 18a and 18b are being formed, the definition in respect of the upper and lower edges of the metallisation portions is not a critical factor.

Figure 3:
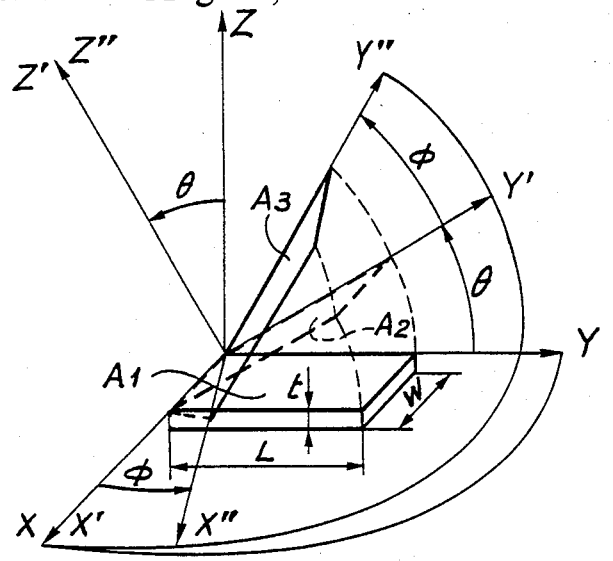
FIG. 3 shows the plane of cut of the quartz plate for producing the resonators according to the invention.

More precisely this cut is of the zywt types FIG. 3 illustrates the two consecutive rotations.

Reference $A_1$ shows the initial position zy of the crystal plate. The length L is parallel to the Y axis, the width w, parallel to the X axis and the thickness t, parallel to the Z axis. A first rotation is provided about the X axis. The angle of rotation is indicated by the symbol $\theta$. The corresponding position of the crystal plate is referenced $A_2$ and the axis are $X' = X$, $Y'$ and $Z'$. A second rotation is provided about the $Z'$ axis. The angle of rotation is indicated by the symbol $\phi$. The final position of the crystal plate is referenced $A_3$ and the axis are $X''$, $Y''$ and $Z'' = Z'$. The absolute value of $\phi$ is less than 20° and the absolute value of $\phi$ is less than 30°. Preferably for time keeping uses, the angle $\phi$ is zero and the angle $\theta$ is from 0° to −10°. For example the angle $\theta$ is −2°.

This cut therefore retains all the advantages of a Z cut, while having a more favourable first order temperature coefficient $\alpha$. As it is well-known, the relation between the frequency f of a quartz resonator and the temperature T is given by the following formula:

$$f(T) = f_o(T_o)[1 + \alpha(T - T_o) + \beta(T - T_o)^2 + \gamma(T - T_o)^3 + \ldots],$$

wherein $\alpha$, $\beta$ and $\gamma$ are constants for a given quartz resonator and $T_o$ is a reference temperature.

Figure 5:
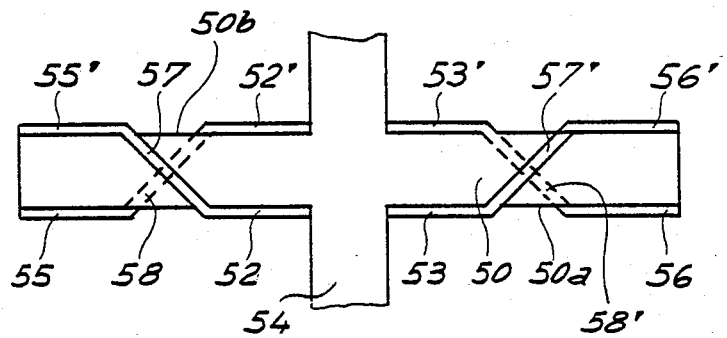
FIG. 5 shows a simplified form of an alternative embodiment of the resonator for producing higher working frequencies.

A resonator according to the invention has been produced, with a natural frequency of 1 MHz, with the following characteristics:

L (length of electrode = length of the bar) = 2.75 mm
w (width of the bar) = 0.1 mm
t (thickness of the bar) = 0.2 mm Such a resonator has a dynamic capacity $C_1$ of 1.88 fF, as compared to the 0.1 fF of the resonators in the prior art. It should also be noted that, because there is no longer any functional metallisation portions on the faces of the bar, the bar can be of very small width, even less than its thickness. This width of 0.1 mm is to be compared to the width of 4.2 mm of the 780 kHz resonator of the prior art. This reduction in width has a decisive influence on the enhancement of $C_1$. In order for such resonators to be operated at higher frequencies (up to 4 MHz) while retaining bars of machinable length, use is made of the method referred to as the "overtone" or 'harmonic' method. FIG. 5 shows a resonator according to the invention which is capable of operating in accordance with that method.

Each side of the bar comprises three separate electrodes which are distributed over the length of the bar. Disposed on one of the sides 50a of the bar 50 is a central electrode formed of two parts 52 and 53 disposed on each side of the support arm 54. The arrangement also includes two electrodes 55 and 56 which are disposed in the vicinity of each of the ends of the bar. The electrodes 52 to 56 are all of substantially the same length. Electrodes 52' to 56' are disposed on the side 50b of the bar 50, facing the electrodes 52 to 56. Electrical connections 57 and 57' formed on the upper face of the bar connect the central electrode 52, 53 to the electrodes 56' and 55', while electrical connections 58 and 58' on the lower face connect the central electrode 52', 53' to the electrode which face them and which generate in the bar, electrical fields which are equal but in different directions in regard to two adjacent groups. It will be seen that there is the central group 52, 53 and 52', 53' and the end groups 55, 55' and 56, 56'. Thus, if $f_o$ is the frequency that the bar would have if it were provided with one electrode on each of its sides, the frequency of the bar excited by the system of electrodes as shown in FIG. 5 is $f' = 3 f_o$. Similarly, it would be possible to produce frequencies of 5 $f_o$, 7 $f_o$, etc, for the same length of bar.

In addition, the resonators according to the invention may be produced by methods which are well known in the art of machining quartz. In particular, as the metallisation portions are of a non-critical geometrical definition, the production thereof does not necessitate masking steps which require a very high degree of accuracy in regard to mask positioning.

It should be added that the dimensions of the resonator are to be chosen so that the frequencies of the flexural partial modes do not coincide with the frequency of the extension-compression mode.

If these conditions are fulfilled, the results is a bar which vibrates in a main extension-compression mode.

Figure 6A:
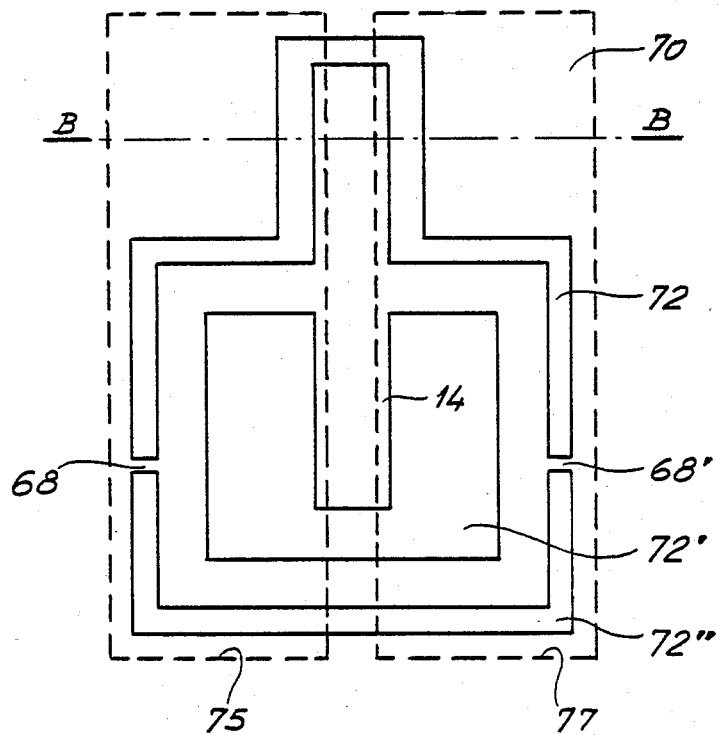
FIGS. 6a and 6b are a plan view and a vertical sectional view of a quartz plate, illustrating a process for producing the resonators according to the invention.
Figure 6B:
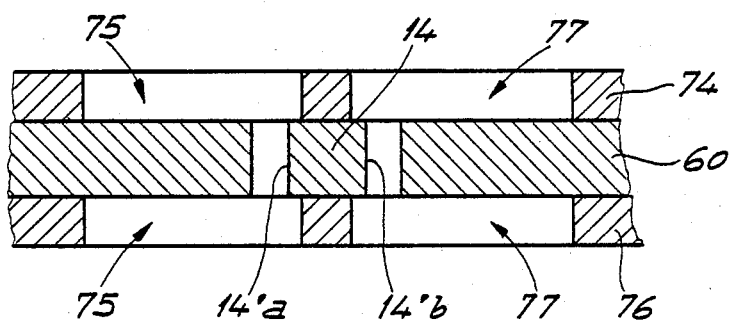

FIGS. 6a and 6b show a possible process for producing resonators according to the invention.

The resonator is cut from a Z cut quartz plate or wafer 60, as described with reference to FIG. 3. The plate 60 has a uniform thickness of 100 to 200 μm. As is well known, a layer of a chromium-gold alloy having the outline of the bar 14 and the suspension assembly is deposited by photolithography. Very weak bridges 68, 68' for attachment to the remainder 70 of the plate which is used for producing other resonators at the same time are also retained.

The plate 60 is then dipped in an acid attack bath (for example a bath of hydrofluoric acid) so that the parts which are not protected by the metal plating are dissolved, giving the slots 72, 72' and 72''. All that remains then is the bar 14 with its supsension assembly, which is connected to the remainder of the plate by the attachment bridges 68 and 68'. The metallisation which had served as a mask is then removed in a suitable bath.

The metallisation portions on the sides 14'a and 14'b of the bar, to form the electrodes, and the metallisation portions on the arms 20a and 20b are then produced in the following manner.

Masking plates 74 and 76 are produced, which have substantially rectangular openings 75 and 77 such that, after the masks 74 and 76 have been set in position on respective sides of the plate 60, the sides 14'a and 14'b of the bar and also the arms are exposed. This is the situation shown in FIG. 6b. On the other hand, the upper and lower faces of the bar are at least partially masked. The metallisation portions on the sides of the bar, that is to say the electrodes, and the metallisation portions on the arms, are produced by subjecting the above-described assembly to a jet of vaporised metal. FIG. 6b shows that the position of the masks 74 and 76 is not critical since the masks only have to cover the central portion of the bar 14 in order thereby effectively to separate the two electrodes. In addition, by virtue of the plate 60 being of Z cut or substantially Z cut chemical etching of the quartz can be easily carried out, with a very good degree of definition. It will also be clearly apparent that this process can be satisfactorily used for producing a large number of resonators from the same quartz plate or wafer.

It will also be appreciated that the operation of depositing the metallisation portions could be performed in a different manner, and likewise the metallisation portions on the sides of the bar, forming the electrodes, could also be defined in a different manner. However, the above-described process appears to be particularly suitable for producing resonators according to the invention in large quantities, for example for electronic analog or digital watches.

Various other modifications of the present invention will be apparent to those skilled in the art, and it therefore is intended that the scope of the present invention be limited solely by the scope of the appended claims.

What is claimed is:

1. A micro-resonator for vibrating in a main extension-compression mode, comprising a Z cut bar; and an integrated suspension assembly for said Z cut bar formed integral with said bar, said bar and suspension assembly being chemically cut from the same plate of piezoelectric material, said bar having a length, a width and a thickness respectively disposed substantially parallel to the Y, X and Z axes of said piezoelectric material, the width of the bar being smaller than the thickness of the bar; an electrode disposed on each side of said bar which extends parallel to the bar length and thickness, for exciting the vibration of the bar; and conducting connections provided on said suspension assembly and electrically connected to the electrodes.

2. A micro-resonator according to claim 1, wherein said suspension assembly comprises two arms disposed on respective sides of said bar, said arms being connected to the bar substantially at the mid-length position thereof.

3. A micro-resonator according to claim 2, wherein each side is provided with a single electrode extending substantially over the whole of said side.

4. A micro-resonator according to claim 2, wherein each side comprises a central electrode disposed on respective sides of the arm and a number 2n of additional electrodes, n being an odd integer, an electrode on one side facing an electrode on another side to form a pair of electrodes, with two consecutive pairs of electrodes being biased to create electrical fields of the same direction but in different ways in the bar.

5. A micro-resonator according to anyone of claims 1, wherein the sides of the bar are parallel to an axis Z' forming with the axis Z an angle which is less than 20° in absolute value.

* * * * *